United States Patent
Mueller et al.

(10) Patent No.: US 6,690,198 B2
(45) Date of Patent: Feb. 10, 2004

(54) REPEATER WITH REDUCED POWER CONSUMPTION

(75) Inventors: Gerhard Mueller, Meitingen (DE); Toshiaki Kirihata, Poughkeepsie, NY (US)

(73) Assignees: Infineon Technologies AG (DE); International Business Machines Corporation, Armonk, NY (US)

( * ) Notice: Subject to any disclaimer, the term of this patent is extended or adjusted under 35 U.S.C. 154(b) by 14 days.

(21) Appl. No.: 10/114,195

(22) Filed: Apr. 2, 2002

(65) Prior Publication Data

US 2003/0184342 A1 Oct. 2, 2003

(51) Int. Cl.[7] .......................................... H03K 19/0175
(52) U.S. Cl. ................. 326/86; 326/56; 326/83
(58) Field of Search .............................. 326/82, 83, 86, 326/56–58

(56) References Cited

U.S. PATENT DOCUMENTS 6,307,397 B1 * 10/2001 Mueller et al. ............... 326/81

FOREIGN PATENT DOCUMENTS

EP        000478253 A2 *   9/1991   ................. 326/82

* cited by examiner

*Primary Examiner*—Don Le
(74) *Attorney, Agent, or Firm*—Lerner, David, Littenberg, Krumholz & Mentlik, LLP

(57) ABSTRACT

A repeater circuit having improved switching speed and reduced power consumption is described. The repeater circuit is configured to receive an input signal from a first segment of a signal line and pass the signal to a second segment of the signal line in response to an active control signal.

8 Claims, 5 Drawing Sheets

REPEATER WITH REDUCED POWER CONSUMPTION

FIELD OF THE INVENTION

The present invention relates generally to integrated circuit (IC) design. In particular, the invention relates to reducing power consumption in ICs.

BACKGROUND OF THE INVENTION

Complementary metal-oxide semiconductor (CMOS) technology has evolved at such a brisk pace that the computer market has rapidly opened to a wide range of consumers. Present-day computers such as multimedia computers require increasingly larger memory capacities, suggesting a potentially strong demand for 256 MB dynamic random access memories (DRAMs) and beyond. The huge size of memory arrays and the lithographic difficulties that ensue pose a difficult challenge of reducing power dissipation in memory chips.

FIG. 1 shows a typical memory unit 100 comprising first and second memory banks 110a and 110b, wherein each memory bank comprises a plurality of memory arrays 105. Each memory array 105 comprises a plurality of memory cells 112. The memory cells in each array 105 are arranged in a matrix, and supported by wordlines (WLs) 114 in the row direction and bitlines (BLs) 115 in the column direction. When the WL 114 is activated by wordline drivers 118, data bits in the selected row cells 112 are simultaneously transferred to BLs 115. When the WL 114 is activated, a small differential sensing signal on each BL pair 115 is caused by charge sharing between the memory cell capacitors and BLs 115. Differential sense amplifiers 116 are used to amplify the small sensing signals to full CMOS differential voltages.

After the BL voltage has been sufficiently amplified, a column select line (CSL) 140 signal activates column switches 122 for selecting BLs 115. Activation of the CSL 140 by the column decoder 120 allows the data bit on the selected BL to be transferred to the local bitline (LDQ) 150. The data bits on the LDQ pairs 150 are transferred to the global dataline (MDQ) pairs 160 via switches 124. A similar memory architecture is disclosed in Yohji Watanabe et.al, "A 286 mm² 256 Mb DRAM with x32 Both Ends," IEEE Journal of Solid-State Circuits, vol. 31:4, pp.567–574, April 1996, which is herein incorporated by reference for all purposes.

Referring to FIG. 2, a driver 210 is used to activate a CSL line 140, the driver typically located in a column decoder 120. The driver, for example, comprises first and second inverters 212 and 214. CSLs are usually implemented in the upper metal layer and coupled to numerous switch transistors, creating a capacitive load. The resistance of the CSL and the capacitive load give rise to a resistor-capacitor (RC) delay. As memory density increases, more memory arrays are stacked in each memory unit, the length and capacitive load of the CSL also increases. Consequently, the RC delay of the CSL also increases, thereby impacting the switching speed of the CSLs. In addition, more power is consumed due to the charging and discharging of a larger capacitive load in the CSLs.

FIG. 3 shows a conventional technique for improving the switching speed of long signal lines. As shown, a repeater circuit 320, comprising first and second inverters 321 and 322, is provided on CSL 140. The repeater separates the CSL into first and second segments 140a and 140b, the first segment being driven by the driver 210 and the second segment being driven by the repeater 320. However, such a repeater circuit only reduces switching time but fails to reduce power consumption.

As evidenced from the foregoing discussion, it is desirable to provide a repeater circuit which improves switching speed as well as reduces power consumption.

SUMMARY OF THE INVENTION

The invention relates generally to integrated circuit design. In particular, the invention relates to repeater circuits having improved switching speed and reduced power consumption.

The repeater circuit is implemented on a signal line and configured to receive an input signal from a first segment of the signal line and pass the signal to a second segment of the signal line in response to an active control signal. In one embodiment of the invention, a grounding device is included for passing a well-defined signal to the second segment in response to an inactive control signal.

DETAILED DESCRIPTION OF THE INVENTION

The invention relates generally to repeater circuits in ICs such as random access memories (RAMs), including dynamic RAMs (DRAMs), high speed DRAMs such as Rambus DRAMs and SLDRAMs, ferroelectric RAMs (FRAMs), synchronous DRAMs (SDRAMs), merged DRAM-logic chips (embedded DRAMs), or other types of ICs.

Figure 1:
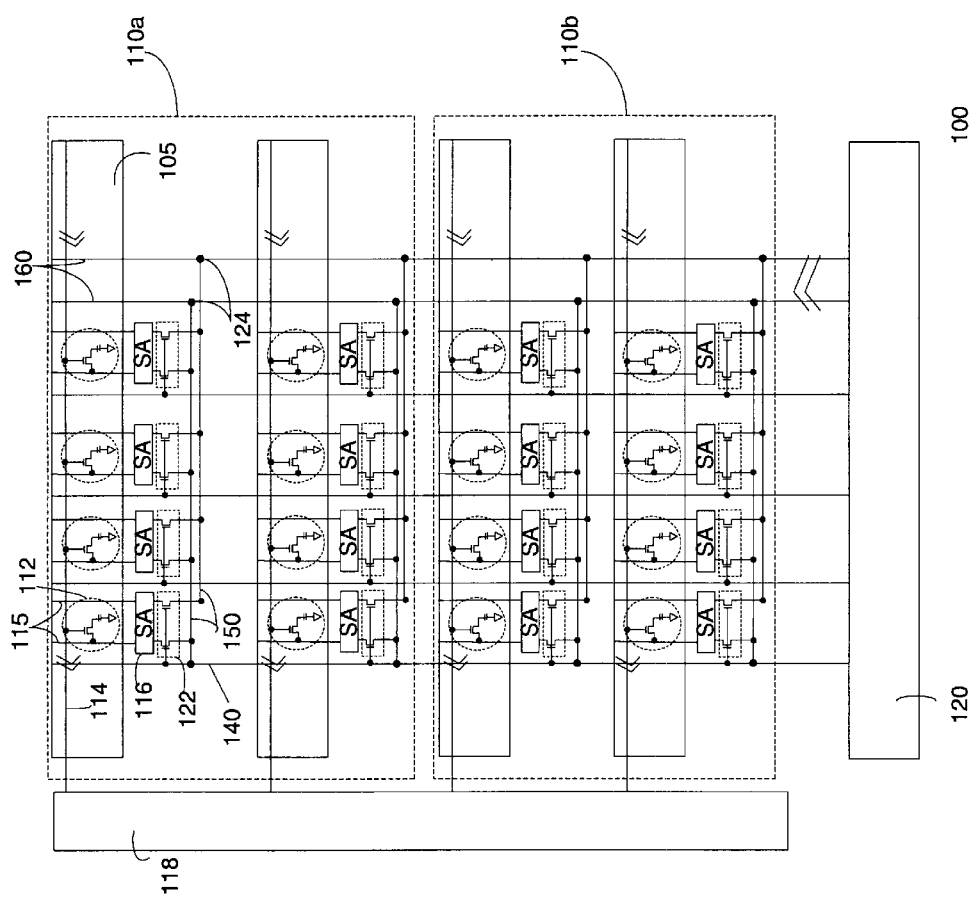
FIG. 1 shows a memory unit of a conventional memory IC.
Figure 2:
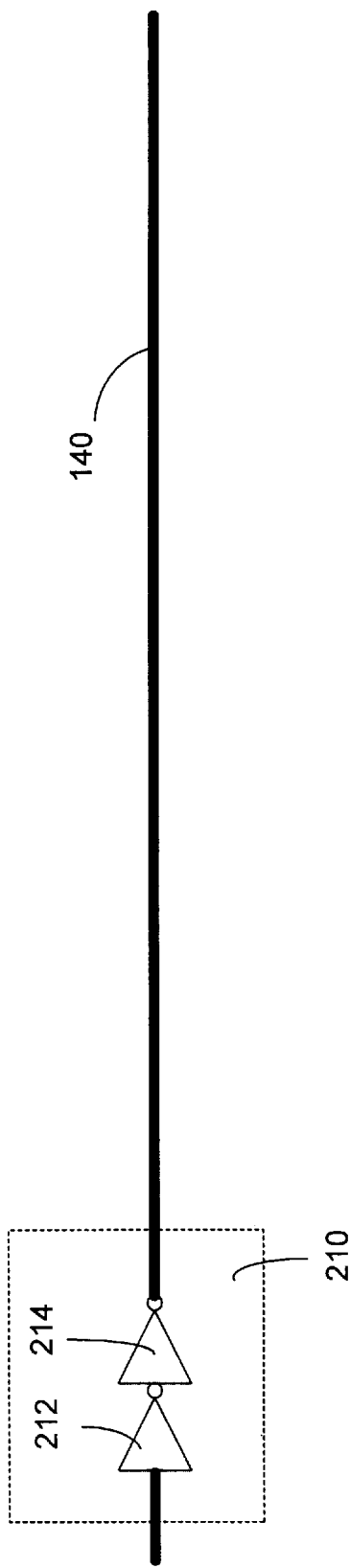
FIG. 2 shows a conventional CSL.
Figure 3:
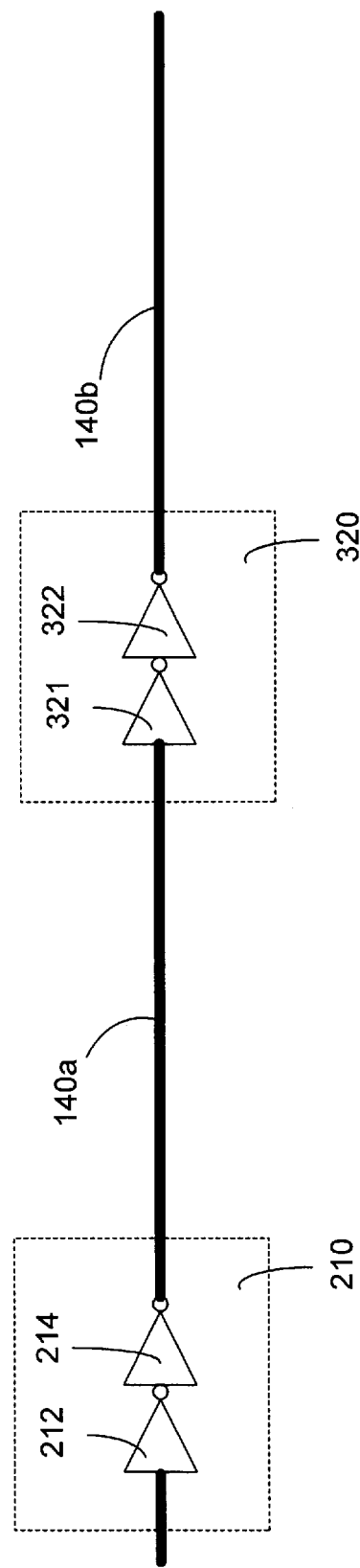
FIG. 3 shows a conventional CSL with repeater circuit.
Figure 4:
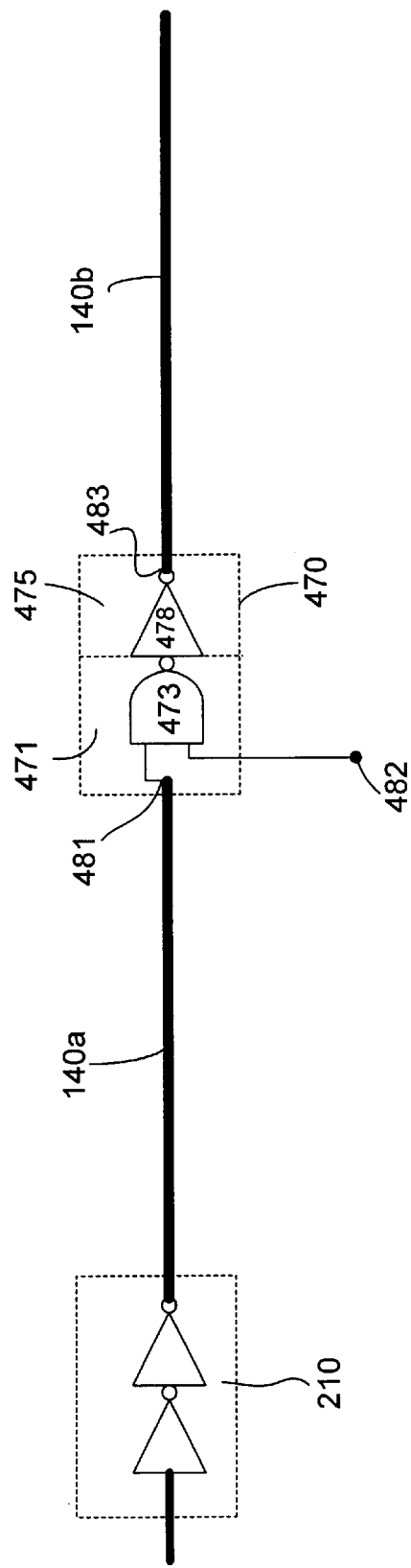
FIGS. 4–6 show various embodiments of the invention for improving switching speed and reducing power consumption in signal lines.

FIG. 4 shows an embodiment of a repeater circuit configuration in accordance with one embodiment of the invention. A repeater circuit 470 is provided, separating a CSL into first and second local segments 140a and 140b. As shown, the CSL 140a in the first segment is driven by the driver 210. The driver 210, for example, is located in a column decoder. The CSL 140b in the second segment is driven by the repeater 470. In one embodiment, the first and second local segments cover different banks of the memory unit. Typically, only one bank within a unit is activated at one time.

The repeater circuit 470 includes an input node 481 and control node 482, and a repeater output node 483. The repeater input node 481 is coupled to the first local segment 140a of the CSL and the control node 482 receives a control signal. The repeater output node 483 is coupled to the second local segment 140b of the CSL. When an active control signal is provided at the control node 482, the repeater circuit 470 is enabled, driving the second local segment 140b when the CSL is selected, for example, when driver 210 is driving the CSL.

In one embodiment, the repeater 470 is disabled when the circuitry coupled to the second local segment 140b is not accessed. The repeater 470 is enabled only when the second local segment needs to be accessed. In the case of a CSL controlling a unit with first and second banks, the repeater is enabled when the second bank is accessed and disabled when the first bank is accessed. By selectively charging the second local segment only when necessary, the repeater circuit enables a reduction in the overall power consumption of the IC.

The repeater circuit, in one embodiment, comprises first and second stages 471 and 475. The first stage is coupled to the repeater input node 481 and the control node 482. The first stage is coupled to the second stage in series, the second stage being coupled to the second local CSL segment 140b via the repeater output node 483.

In one embodiment, the first stage comprises a NAND gate 473. A first input node of the NAND gate 473 is coupled via the repeater input node 481 to the first local segment 140a, the first local segment being driven by the CSL driver 210. A second input node of the NAND gate 473 is coupled to the control node 482. In one embodiment, the second stage of the repeater circuit comprises an inverter 478, an input node of the inverter being coupled to the output node of the NAND gate 473. An output of the inverter 478 is coupled the second local segment 140b via output node 483.

Figure 5:
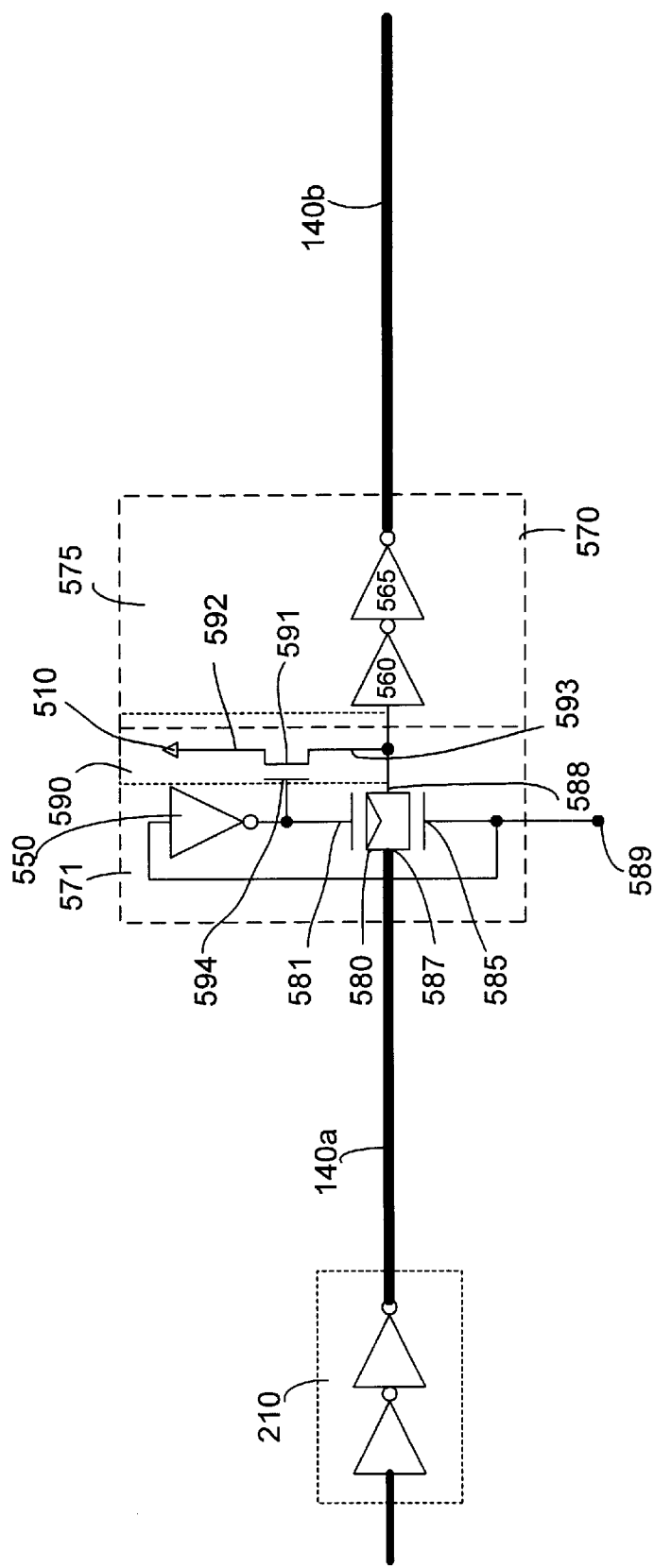

FIG. 5 shows a repeater circuit 570 in accordance with another embodiment of the invention. The repeater circuit includes first and second stages 571 and 575. The first stage includes a transmission gate 580 comprising first and second transistors 581 and 585 coupled in parallel. A first common terminal 587 of the transistors coupled to the first repeater input node and is coupled to the first local CSL segment 140a. As discussed previously, the CSL 140a in the first local segment is driven by the driver 210. A second common terminal 588 of the transistors is coupled to the second stage. The gates of the transistors are coupled to a control node 589 of the repeater circuit.

In one embodiment, one of the transistors in the transmission gate 580 is a p-type FET and the other is an n-type FET. Illustratively, the first transistor 581 is a p-type FET and the second transistor 585 is an n-type FET. For an active high control input signal, an inverter 550 is provided to invert the control signal for the p-type FET. Conversely, an inverter is provided to invert the control signal for the n-type FET in the case of an active low control signal.

In one embodiment, the second stage comprises first and second inverters 560 and 565 coupled in series. An active control signal 589 causes the second local segment 140b to be coupled to the first local segment 140a via the repeater circuit while an inactive control signal isolates the second local segment 140b from the first local CSL segment 140a.

In one embodiment, a grounding device 590 is used to provide a well-defined signal to the second local segment 140b in response to an inactive control signal when the second local segment 140b is not driven. An inactive control signal causes the grounding device to pull the second local segment 140b to ground. In one embodiment, the grounding device comprises an electronic switch, such as a transistor, which couples the second local segment, directly or indirectly, to ground 510. As shown in FIG. 5, the grounding device comprises a n-type FET 591. A first terminal 592 of the FET is coupled to ground and a second terminal 593 is coupled to the input of the second stage. The gate 594 of the FET 591 is coupled to the inverted control signal (for applications where the control signal is active high). An inactive control signal causes the second local segment 140b to be coupled to ground via the second stage, thus providing a well-defined signal when the second local segment is decoupled from the first local segment. Conversely, an active control signal decouples the second local segment from ground, enabling the repeater circuit to drive it. Alternatively, the second terminal 593 of the grounding device can be coupled directly to the second local segment 140b.

Figure 6:
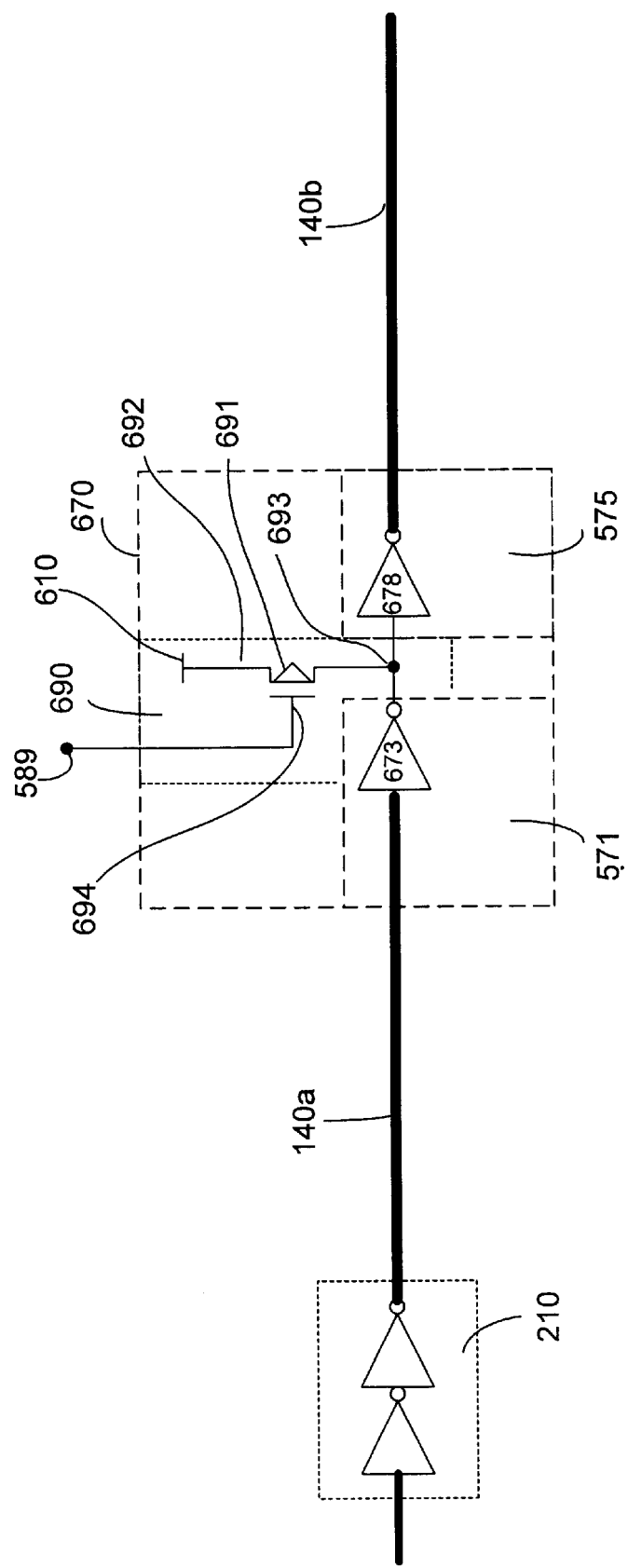

FIG. 6 shows yet another embodiment of a repeater circuit 670. The repeater circuit includes first and second stages 571 and 575. The first and second stages respectively comprise inverters 673 and 678 coupled in series. An input of the first stage is coupled to the first local CSL segment 140a via the repeater input node and an output of the second stage is coupled to the second local CSL segment 140b via the repeater output node. A grounding device 690 is provided between the first and second stages. In one embodiment, the grounding device includes an electronic switch 691, such as a transistor. In one embodiment, the switch comprises a p-type FET having first terminal 692 coupled to a power source 610 at a logic 1 level and a second terminal coupled to the node 693, which is coupled to the output of the first stage and input of the second stage. A gate 694 of the transistor is coupled to the control signal applied at input node 589 of the repeater circuit.

In operation, an inactive control signal couples logic 1 power source to the input of the second stage, causing the inverter to pull the second local segment 140b to ground. An active high control signal decouples the logic 1 power source from the second stage, enabling the repeater to drive the second local segment when the driver 670 is enabled. Alternatively, the switch of the grounding device comprises an n-type FET if an active low control signal is applied.

In yet another embodiment of the invention, the grounding device 690 of FIG. 6 can be implemented between the NAND gate 473 and inverter 478 of FIG. 4. Alternatively, the grounding device 590 of FIG. 5 can be coupled to the output of the inverter 483 of FIG. 4.

While the invention has been particularly shown and described with reference to various embodiments, it will be recognized by those skilled in the art that modifications and changes may be made to the present invention without departing from the spirit and scope thereof. Merely by way of example, the invention can be useful for reducing the adverse impact of coupling noise in any type of differential signal lines. The scope of the invention should therefore be determined not with reference to the above description but with reference to the appended claims along with their full scope of equivalents.

What is claimed is:

1. A repeater circuit implemented on a signal line of an integrated circuit, the repeater circuit comprising:

a repeater input node coupled to a first segment of the signal line to receive an input signal;

a control node to receive a control signal;

a repeater output node coupled to a second segment of the signal line to pass the input signal to the second segment in response to an active control signal;

a first stage comprising a NAND logic gate having a first input node, a second input node and an output node, the first input node being coupled to the repeater input node and the second input node being coupled to the control node; and a second stage coupled to the output node of the first stage;

wherein the first and second stages are coupled in series.

2. The repeater circuit of claim 1 wherein the second stage comprises an inverter, the inverter having an input node coupled to the output node of the NAND logic gate, and an output node coupled to the repeater output node.

3. A repeater circuit implemented on a signal line of an integrated circuit, the repeater circuit comprising:
- a first stage comprising a transmission gate, the transmission gate including first and second transistors coupled in parallel, the first and second transistors having a first common terminal, a second common terminal, and at least one gate;
- a second stage coupled to the second common terminal;
- a repeater input node coupled to a first segment of the signal line to receive an input signal, the repeater input node being coupled to the first common input terminal;
- a control node to receive a control signal, the control node being coupled to the at least one gate of the first stage; and
- a repeater output node coupled to a second segment of the signal line to pass the input signal to the second segment in response to an active control signal;
- wherein the repeater output node is coupled to the second stage, and the first and second stages are coupled in series.

4. The repeater circuit of claim 3 wherein the second stage comprises first and second inverters coupled in series.

5. The repeater circuit of claim 4 further including a grounding device for passing a well-defined signal to the second segment in response to an inactive control signal.

6. A repeater circuit implemented on a signal line of an integrated circuit, the repeater circuit comprising:
- a repeater input node coupled to a first segment of the signal line to receive an input signal;
- a control node to receive a control signal;
- a repeater output node coupled to a second segment of the signal line to pass the input signal to the second segment in response to an active control signal; and
- a grounding device for passing a well-defined signal to the second segment in response to an inactive control signal.

7. The repeater circuit of claim 6 wherein the grounding device is provided between the first and second stages and coupled to the control node, the grounding device pulling the second segment to ground via the second stage in response to the inactive control signal.

8. The repeater circuit of claim 7 wherein the first and second stages respectively comprise first and second inverters coupled in series, the first inverter having an input node coupled to the repeater input node and the second inverter having an output node coupled to the repeater output node.

* * * * *